United States Patent
Wong et al.

(10) Patent No.: US 11,249,121 B2
(45) Date of Patent: Feb. 15, 2022

(54) METHOD OF UTILITY USAGE DIVERGENCE IDENTIFICATION BETWEEN RECURRING CONSUMPTION DATA INDICATIVE OF REPEATING PERIODIC CONSUMPTION PATTERNS AND UTILITY CONSUMPTION DATA

(71) Applicant: CENTRICA HIVE LIMITED, Windsor (GB)

(72) Inventors: Timothy Wong, Reading (GB); Neal Coady, Windsor (GB)

(73) Assignee: CENTRICA HIVE LIMITED, Windsor (GB)

(*) Notice: Subject to any disclaimer, the term of this patent is extended or adjusted under 35 U.S.C. 154(b) by 832 days.

(21) Appl. No.: 16/026,347

(22) Filed: Jul. 3, 2018

(65) Prior Publication Data

US 2019/0004098 A1 Jan. 3, 2019

(30) Foreign Application Priority Data

Jul. 3, 2017 (GB) .................................. 1710674

(51) Int. Cl.
*G01R 22/10* (2006.01)
*G06Q 50/06* (2012.01)
(Continued)

(52) U.S. Cl.
CPC .............. *G01R 22/10* (2013.01); *G01D 4/002* (2013.01); *G01R 21/133* (2013.01); *G05B 17/02* (2013.01);
(Continued)

(58) Field of Classification Search
CPC .. G01R 22/10; G01R 21/133; G05B 23/0254; G05B 17/02; G05B 23/0221;
(Continued)

(56) References Cited

U.S. PATENT DOCUMENTS

2007/0156510 A1* 7/2007 Kim ....................... G06Q 30/02
705/7.31
2010/0324962 A1 12/2010 Nesler et al.
(Continued)

OTHER PUBLICATIONS

Sun Ic Kim et al., "Power usage pattern and consumption separation method by load devices based on remote metering system's Load profile data", 2011 11th International Conference on Control, Automation and Systems, Retrieved from the Internet URL:<https://ieeexplore.ieee.org/document/6106221> (Year: 2011).*

(Continued)

*Primary Examiner* — Kenneth M Lo
*Assistant Examiner* — Jonathan Michael Skrzycki
(74) *Attorney, Agent, or Firm* — Tucker Ellis LLP; Michael G. Craig

(57) ABSTRACT

A method and apparatus for analysing utility consumption at a utility supply location is described. The method comprises the steps of: receiving utility consumption data corresponding to utility consumption at the utility supply location over a time period to be analysed; generating a recurring consumption model indicative of repeating consumption patterns in the utility consumption data; identifying divergences between the utility consumption data and the recurring consumption model; computing a diagnostic measure indicative of irregular consumption based on the identified divergences; and outputting the diagnostic measure. The diagnostic measure may be used to identify flexibility or irregularities in consumption and/or to control supply of the utility. The utility may be e.g. electricity, gas or water.

19 Claims, 10 Drawing Sheets

(51) Int. Cl.
  *G05B 23/02*     (2006.01)
  *G05B 17/02*     (2006.01)
  *G01D 4/00*      (2006.01)
  *G01R 21/133*    (2006.01)

(52) U.S. Cl.
  CPC ..... *G05B 23/0205* (2013.01); *G05B 23/0221* (2013.01); *G05B 23/0254* (2013.01); *G05B 23/0262* (2013.01); *G06Q 50/06* (2013.01)

(58) Field of Classification Search
  CPC ............ G05B 23/0262; G05B 23/0205; G06Q 50/06; G01D 4/002
  See application file for complete search history.

(56) References Cited

U.S. PATENT DOCUMENTS

| | | | |
|---|---|---|---|
| 2014/0058572 A1* | 2/2014 | Stein ................ | H02J 13/00004 700/291 |
| 2014/0278165 A1 | 9/2014 | Wenzel et al. | |
| 2014/0285357 A1* | 9/2014 | Schlaeffer ............... | G06F 30/20 340/870.02 |
| 2015/0309089 A1* | 10/2015 | Katsukura ........ | G01R 19/16547 324/511 |

OTHER PUBLICATIONS

European Search Report, extended report corresponding to European Application No. EP18181505, Date of Completion Oct. 17, 2018, Munich, Germany, pp. 1-7.

\* cited by examiner

METHOD OF UTILITY USAGE DIVERGENCE IDENTIFICATION BETWEEN RECURRING CONSUMPTION DATA INDICATIVE OF REPEATING PERIODIC CONSUMPTION PATTERNS AND UTILITY CONSUMPTION DATA

CROSS-REFERENCE TO RELATED APPLICATIONS

This application claims priority to United Kingdom Patent Application No. 1710674.1, entitled METHOD OF UTILITY USAGE ANALYSIS, filed Jul. 3, 2017, which is incorporated herein by reference.

BACKGROUND

The present invention relates to analysis of energy usage. More particularly, the present invention relates to analysis of power or electricity consumption over time.

Energy consumption is not constant and tends to vary over time, e.g. with varying demand at different times of the day, week and year. For instance, electricity demand during peak periods can be significantly higher than during off-peak periods within the same day. This creates incentives for allocating energy load to off-peak periods and/or adjusting energy supply for efficient power generation, supply and load balancing.

Electrical grid transmission, especially in local distribution grids, is coming under increasing strain as more electric cars, heat pumps and other electrical loads are added as part of the ongoing trend to decarbonise energy use to meet climate change targets. One way to manage this would be to update the infrastructure to increase the network capacity, which would involve large construction projects (such as digging up roads), take a long time (estimated to be a decade or more in the UK), and be very expensive. However, controlling energy consumption and/or energy generation/supply patterns may allow efficient management of the grid and provide the ability to keep up with demand without largescale replacement of infrastructure.

Some utility meters, such as "smart meters", have facilities for monitoring consumption and communicating with the supplier remotely, e.g. over wide area networks (WANs) using mobile telecommunication cellular technology, such as GPRS or 3G. Smart meters generally record consumption data at each premises, or supply point, at fixed intervals with high granularity, such as every 30 minutes.

SUMMARY

Aspects of the invention are set out in the independent claim and preferred features are set out in the dependent claims.

There is described herein a method of analysing utility consumption at a utility supply location, the method comprising the steps of: receiving utility consumption data corresponding to utility consumption at the utility supply location over a time period to be analysed; generating a recurring consumption model indicative of repeating consumption patterns in the utility consumption data; identifying divergences between the utility consumption data and the recurring consumption model; computing a diagnostic measure indicative of irregular consumption based on the identified divergences; and outputting the diagnostic measure.

By analysing utility consumption based on recurring consumption (e.g. consumption that has a repeating and/or predictable pattern) and divergences from that recurring consumption, it may be possible to identify or classify irregular consumption, which can be helpful in managing supply and demand of the utility. Advantageously, by determining a measure of irregular consumption it is possible to provide improved and more efficient control of utility supply and/or demand and thus reduce the likelihood of power outages or other adverse consequences.

Identifying utility consumption irregularities may also be used to identify existing faults, such as gas leaks or serious electrical supply faults or water main leaks and may be used to trigger safety or preventative measures.

The term "supply location" as used herein may relate to a utility supply point, such as the point at which gas/electricity/water enters a consumer premises (such as a home, commercial premises etc.). For example the supply location may be associated with a particular utility supply point. The supply location may refer to the location or area around the supply point or supplied by that supply point, e.g. the location which is supplied with the utility passing through the supply point. A supply location could for example correspond to a particular building or premises (or part thereof), e.g. a house, apartment, or other residential or commercial property. Generally a meter will be provided at a supply point to measure utility consumption at that point. Unless otherwise specified or made clear from the context, the terms "supply point" and "supply location" may be used interchangeably.

The method may further comprise the step of: sending a message to adjust, based on the diagnostic measure, one or both of: the utility supply from one or more suppliers; and the utility consumption of one or more utility supply locations. Thus the problem of how to balance supply and consumption more effectively can be solved by managing consumption and/or supply based on the diagnostic measure of irregular consumption, which may e.g. be indicative of the frequency of consumption. The message may specify control of utility supply equipment (e.g. generators feeding the electricity grid or water level control equipment at reservoirs feeding the water grid) or utility consumption equipment (e.g. appliances at a supply point) The message may, for example, include a control command to utility supply or generation equipment, e.g. to increase or decrease production or supply to the grid at certain times, or may include a command to control operation of appliances or other utility consuming equipment at an energy supply point.

In some embodiments, the method may further comprise: identifying an abnormality or error in utility supply or utility supply equipment based on the diagnostic measure; and sending a message to effect correction or mitigation of the abnormality or error to utility supply equipment or an operator thereof.

Preferably, generating a recurring consumption model comprises performing a frequency analysis to determine frequency components of the utility consumption data.

Preferably, the method further comprises selecting one or more frequency components (preferably not including all determined frequency components) and generating the recurring consumption model based on the selected frequency components, preferably wherein the frequency components are selected in dependence on frequency coefficients, each frequency coefficient indicating a strength of a respective frequency in the utility consumption data. For example, a frequency component with a relatively large coefficient may be indicative of repetitive consumption, e.g.

consumption of a similar volume that happens at roughly the same time each day/week (or other repetitive period).

In some embodiments, generating a recurring consumption model comprises: performing a frequency domain transform on the utility consumption data to compute a frequency domain representation of the consumption data; discarding frequencies from the frequency domain representation according to a frequency discard criterion; and performing an inverse frequency domain transform on the frequency domain representation comprising the non-discarded frequencies to create a time domain representation of the consumption data based on the non-discarded frequencies.

Optionally, the method further comprises: calculating a difference between the time domain representation of the consumption data based on the non-discarded frequencies and the received utility consumption data; determining whether the calculated difference satisfies a correlation criterion; and if the calculated difference satisfies the correlation criterion, using the time domain representation of the consumption data based on the non-discarded frequencies as the recurring consumption model.

Preferably, determining whether the calculated difference satisfies a correlation criterion comprises: calculating an autocorrelation function on the difference between the received utility consumption data and the time domain representation of the consumption data based on the non-discarded frequencies; and determining whether the autocorrelation function satisfies the correlation criterion.

In some embodiments, determining whether the autocorrelation function satisfies the correlation criterion comprises: identifying statistically significant peaks in the autocorrelation function; computing the proportion of statistically significant peaks in the autocorrelation function; and determining whether the proportion is below a predetermined correlation threshold. The proportion of statistically significant peaks may be calculated as a percentage, e.g. the statistically significant peaks as a percentage of the total number of peaks.

Preferably, the method further comprises, if the calculated difference does not satisfy the correlation criterion: updating the frequency discard criterion; and repeating (using the updated frequency discard criterion) the steps of: performing a frequency domain transform on the utility consumption data to compute a frequency domain representation of the consumption data; discarding frequencies from the frequency domain representation according to a frequency discard criterion; and performing an inverse frequency domain transform on the frequency domain representation comprising the non-discarded frequencies to create a time domain representation of the consumption data based on the non-discarded frequencies, and optionally also repeating the steps of: calculating a difference between the time domain representation of the consumption data based on the non-discarded frequencies and the received utility consumption data; determining whether the calculated difference satisfies a correlation criterion; and if the calculated difference satisfies the correlation criterion, using the time domain representation of the consumption data based on the non-discarded frequencies as the recurring consumption model. Thus the recurring consumption model may be refined by updating the frequency discard criterion and determining a new recurring consumption model based on that. These steps may be repeated until the correlation criterion is satisfied or until a cut-off is reached e.g. until the frequency discard criterion has been updated a pre-determined number of times and/or a pre-determined number of iterations have been performed.

In some embodiments the frequency domain representation comprises a set of frequency modes, and discarding frequencies from the frequency domain representation comprises: sorting the frequency modes by magnitude; and discarding a discard number of the lowest magnitude frequency modes, the discard number being determined by the frequency discard criterion. The magnitude may be, or be based on, the frequency coefficient. Thus the "weaker" or lower magnitude frequency modes can be removed. E.g. where the discard number is, say, 10, the $10^{th}$ lowest magnitude frequency modes (or modes with the smallest frequency coefficients) may be discarded.

Preferably, updating the frequency discard criterion comprises increasing the discard number. For example, the discard number may be increased by a predetermined increment, e.g. by one, three or five.

Preferably, the frequency domain representation is a Fourier transform. In such cases an inverse Fourier transform can be used to convert the frequency domain representation back into the time domain, once frequency selection or filtering has been performed. This representation in the time domain may be used as the recurring consumption model. For example, a Fast Fourier Transform (FFT) may be used.

Generally, the recurring consumption model comprises a times series of utility consumption data representative of repeating consumption patterns.

Preferably, identifying divergences between the utility consumption data and the recurring consumption model comprises: determining a set of residual consumption data from the difference between the utility consumption data and the recurring consumption model; and detecting signal features in the residual consumption data indicative of divergences.

Preferably, detecting signal features indicative of divergences comprises: identifying spikes in the residual consumption data, preferably wherein a spike comprises an elevated or reduced period of consumption compared to the recurring consumption model.

Preferably, identifying spikes in the residual consumption data comprises: identifying rising and/or falling edges in the residual consumption data, preferably by calculating the difference between consecutive residual consumption data values. For example, the spikes may be increases (or decreases) in the residual consumption of more than a certain magnitude (preferably in a certain time period). Spikes may be identified by calculating the first order differential with respect to time; the differential being more than a predetermined differential magnitude may be indicative of a spike.

Preferably, the method further comprises: filtering the identified divergences based on one or more divergence discard criteria, and wherein computing the diagnostic measure is performed using the filtered divergences.

Preferably, filtering the identified divergences comprises: discarding divergences having a magnitude of less than a predetermined divergence magnitude threshold. For example, the maximum consumption magnitude of the divergence (or spike) from the residual consumption model may be considered.

Preferably, where the utility is energy, the predetermined divergence magnitude threshold is at least 0.1 kWh, preferably at least 0.5 kWh, more preferably around 1 kWh. Preferably the predetermined divergence magnitude threshold is less than 20 kWh, preferably less than 10 kWh or 5 kWh, more preferably less than 3 kWh or 2 kWh.

Optionally, filtering the identified divergences comprises: identifying two or more divergences occurring within a predetermined divergence time window of each other; and discarding one or more of the identified divergences having the lowest magnitude(s). For example, this may involve discarding all but highest magnitude divergences, or spikes, within a time window.

Preferably, computing a diagnostic measure comprises: determining a measure of the incidence of divergences between the utility consumption data and the recurring consumption model. The measure of the incidence of divergences may for example be the (average) frequency of divergences.

In some embodiments, determining the incidence of divergences comprises: dividing the time period to be analysed into a plurality of time slots for analysis; identifying time slots having at least a threshold number of divergences; and determining the number or proportion of time slots having at least the threshold number of divergences.

Preferably, the threshold number of divergences in each time slot for analysis is one.

Optionally, the time slots for analysis each correspond to a day or week within the time period to be analysed.

Preferably, the time slots each correspond to a portion of a day or week, preferably a portion categorised as a peak utility usage portion.

In some embodiments, computing a diagnostic measure further comprises: calculating the diagnostic measure as, or based on, the ratio of predetermined time slots having at least a threshold number of divergences to the total number of time slots in the time period to be analysed.

Preferably, the method further comprises the step of: pre-processing the received utility consumption data, optionally to compensate for abnormalities in the received consumption data, for example to compensate for errors or omissions in measurement of consumption data values, and using the pre-processed utility consumption data when generating the recurring consumption model, identifying divergences between the utility consumption data and the recurring consumption model and/or computing the diagnostic measure.

Preferably, the step of pre-processing the received utility consumption data comprises: identifying missing consumption data in the received consumption data, the missing consumption data comprising time points or intervals in the time period having no corresponding consumption value; estimating a consumption value for each time point or interval having no corresponding consumption value; and inserting the estimated consumption data values into the received consumption data to create a continuous set of consumption data. A "continuous" set of consumption data may e.g. mean a set of data having a consumption value for each time value in the time period to be analysed at a given time resolution. Where time intervals having missing consumption data are identified, a series of values for each time value in that time interval may be determined.

Preferably, the step of estimating a consumption value for each time point or interval having no corresponding consumption value comprises: calculating a proposal probability distribution using the received consumption data; selecting a time point or interval having no corresponding consumption value; estimating a consumption value for the selected time point or interval based on the proposal probability distribution.

In some embodiments, estimating a consumption value for the selected time point or interval based on the proposal probability distribution comprises: selecting randomly a proposed value for the corresponding consumption value; calculating the probability likelihood of the proposed consumption value using the proposal probability distribution; and determining whether the probability likelihood of the proposed consumption value satisfies a probability criterion.

Preferably, the method further comprises, before determining whether the probability likelihood of the proposed consumption value satisfies a probability criterion: selecting randomly a proposed jump from the proposed value for the corresponding consumption value; and calculating the probability likelihood of the proposed jump from the proposed value using the proposal probability distribution; and wherein: the probability criterion is based on the probability likelihood of the proposed jump from the proposed value.

In some embodiments, the step of pre-processing the received utility consumption data comprises: identifying duplicated data in the received consumption data, the duplicated data being indicative of a time point or interval in the time period having more than one corresponding consumption value; and removing the duplicated data from the received consumption data.

Preferably, the step of pre-processing the received utility consumption data comprises: aggregating consumption data values in the consumption data to reduce the time resolution of the consumption data.

Preferably, the method further comprises: computing the diagnostic measure for each of a plurality of supply locations.

In some embodiments, the method further comprises: selecting one or more supply locations based on their respective diagnostic measures, the selected supply locations preferably having diagnostic measures exceeding a threshold, and transmitting consumption control (e.g. timing or shifting) information to the identified supply locations or users/user devices associated with the identified supply locations so that consumption can be shifted.

Optionally, transmitting consumption control information comprises transmitting a message designed to prompt a user or operator to alter utility consumption of appliances at the supply location.

Preferably, the method further comprises the step of: controlling the supply of the utility in a utility supply grid that supplies the utility supply location based on the diagnostic measure or based on diagnostic measures computed for a plurality of supply locations, optionally by altering a parameter of the supply grid, preferably by altering a supply schedule based on the diagnostic measure and/or by controlling the quantity and/or rate of the utility input into the supply grid.

There is also described herein a method of controlling utility supply in a utility supply grid comprising: analysing utility consumption using a method as set out in any preceding claim for a plurality of supply locations to output a plurality of diagnostic measures; creating or altering a supply grid control model based on the plurality of diagnostic measures; sending commands to supply grid equipment according to the control model.

In some embodiments, sending commands to supply grid equipment comprises sending commands to change the capacity of the supply grid, such as changing the operation of energy generation equipment.

Preferably, the consumption data comprises a set of time readings each having a corresponding utility consumption value, and wherein each utility consumption value is indicative of utility consumption over a time interval within the time period to be analysed indicated by the time reading, more preferably wherein the time intervals are equal.

In some embodiments, the time intervals are each less than or equal to six hours, preferably less than or equal to four hours, more preferably less than or equal to two hours or one hour. In some embodiments, the time intervals are each more than or equal to 10 minutes, preferably more than or equal to 20 minutes, and more preferably around 30 minutes.

Preferably, the time period to be analysed is at least one day, three days or seven days, preferably at least 14 days or 28 days, more preferably at least 60 days or at least 90 days, optionally at least six months or one year.

Preferably, the received utility consumption data is received from a utility meter via a communications network, the utility meter preferably located at the supply location, and comprises consumption data values measured by the utility meter.

In some embodiments, the diagnostic measure is a single value or metric, or a set of diagnostic data.

Preferably, the diagnostic measure comprises a utility consumption flexibility score indicating a degree of flexibility of the utility consumption behaviour at the supply location. Thus in some embodiments the method may include allocating the supply location to a consumption flexibility category, and then to manage supply or consumption based on that category.

In some embodiments, the utility comprises energy, and the utility consumption data comprises energy consumption data. Preferably, the utility comprises energy supplied in the form of electricity or in the form of fuel such as gas or oil.

In alternative embodiments, the utility comprises water.

There is also described herein a computer system or computing device having means, preferably in the form of a processor with associated memory, for performing any method as set out herein.

There is also described herein a computer readable medium comprising software code adapted, when executed on a data processing apparatus, to perform any method as set out herein.

Embodiments of the invention can allow data from smart meters to be used to establish an individual load profile for each and every supply point (or customer). Supply points with flexible consumption can be identified if their consumption deviates from their usual behaviour (e.g. does not conform very well to its observed recurring pattern).

Any system feature as described herein may also be provided as a method feature, and vice versa.

Any feature in one aspect of the invention may be applied to other aspects of the invention, in any appropriate combination. In particular, method features may be applied to system aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

BRIEF DESCRIPTION OF THE DRAWINGS

Embodiments will now be described, by way of example only and with reference to the accompanying drawings, in which.

DETAILED DESCRIPTION

Figure 1A:
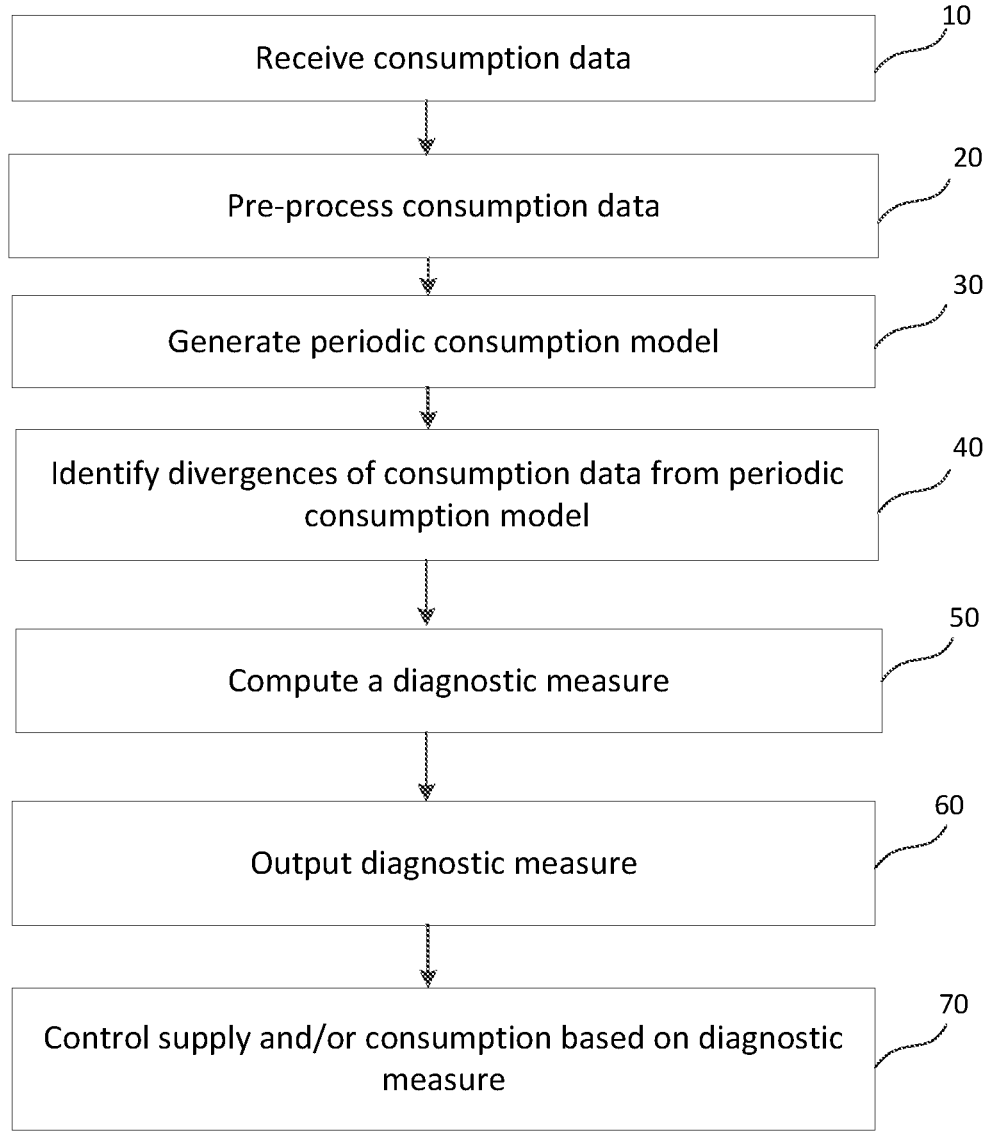
FIG. 1A illustrates an exemplary method for analysing data relating to energy consumption.

FIG. 1A shows a method 1 that may be used for analysing usage of energy (e.g. electricity/gas), or other utilities (e.g. water). At step 10 consumption data is received. This consumption data generally is based on the measured consumption at a user's premises. For example, it may be a list of values indicating the amount of energy consumed or supplied at an energy supply location or supply point over time. A supply point may be a point on a utility distribution network or grid at which a consumer's premises is connected to allow supply of the utility to the consumer. For example, this may be the point at which a user's home is connected to the electricity grid or where a business premises (e.g. an office or a retail outlet) is connected to the grid. A supply point may be a specific building or office space, or even supply to a specific piece of apparatus or plant. Such supply may be monitored via a dedicated sensor e.g. current sensor. Generally all electricity/gas/water supplied to the consumer will pass through the supply point and be measured or monitored by a meter.

The consumption data will generally be a time series of discrete values. Generally each value is indicative of consumption during a time interval. Normally these time intervals will be regular intervals, e.g. every 30 minutes or every hour. In some cases shorter intervals may be used, e.g. around a minute or 30 seconds, with some metering systems supporting metering intervals of 10 seconds or even less. Shorter metering intervals (down to millisecond resolution) may be supported by future systems. It is envisaged that the present invention may be used with meter data of any temporal resolution.

The consumption data may be received from a smart meter which has measured the consumption. The consumption data may be received each time a new value is measured, or a series (or set) of a plurality of consumption values may be received at the same time.

In some cases, the consumption data of a supply point may be the only input required to determine a diagnostic value. The process of computing a diagnostic value for one supply point may have no effect on any other supply points. In other words, the algorithm may be self-contained which means that it may be possible to compute in parallel diagnostic values for different supply points efficiently on any computer cluster platform. Advantageously, this may also provide some sort of computational resilience as failure at one place may have no effect on the rest of the process.

At step 20 the consumption data is pre-processed. Step 20 is optional, and may not be present in all embodiments. In some embodiments no pre-processing of consumption data is required. Pre-processing may include filling in gaps in the data to provide a continuous data set over a time period. Additionally or alternatively, pre-processing may include aggregating data values.

At step 30 a periodic, or recurring, consumption model is generated. This model is based on recurring patterns or trends in the consumption data. For example, this may include variations in consumption which are repeated on a daily, weekly or yearly basis. Thus this model may show a general trend in consumption, which may be predictable.

At step 40 divergences of the consumption data from the periodic consumption model are identified. These divergences show irregular consumption that does not fit into the periodic, or recurring, consumption model. For example, this may indicate unusual or irregular consumption which does not fit a repetitive pattern.

At step 50 a diagnostic measure is calculated based on the consumption which does not fit a recurring/periodic pattern or trend. This diagnostic measure is normally based on the divergences of the consumption data from the periodic consumption model which were identified at step 40. This diagnostic measure may be indicative of irregular consumption behaviour. For example it may be indicative of a degree to which the consumption fits, or does not fit, the recurring consumption model and/or of the frequency and/or strength of divergences from the recurring consumption model. At step 60 the calculated diagnostic measure is output. The diagnostic measure may be in the form of a single value or metric, or a set of diagnostic data.

The diagnostic measure may be used as an indicator of the flexibility of the energy supply point with regard to energy consumption—an energy supply point with highly regular consumption patterns may be considered relatively inflexible, whilst an energy supply point with irregular consumption patterns may be considered flexible. The consumption of flexible supply points may be adjusted without adverse consequences on the operations performed or equipment or appliances run (e.g. by sending a message or command to utility supply points to shift energy usage to times of reduced load on the grid). Thus, the diagnostic measure may provide (or be used as the basis for) an energy consumption flexibility measure or classification.

Optionally, at step 70, the supply and/or the consumption may be controlled based on the diagnostic value that was output at step 60. This could, for example, include load balancing, demand response, and/or increasing or decreasing the amount of energy (or utility, such as water) supplied to a supply grid.

Figure 1B:
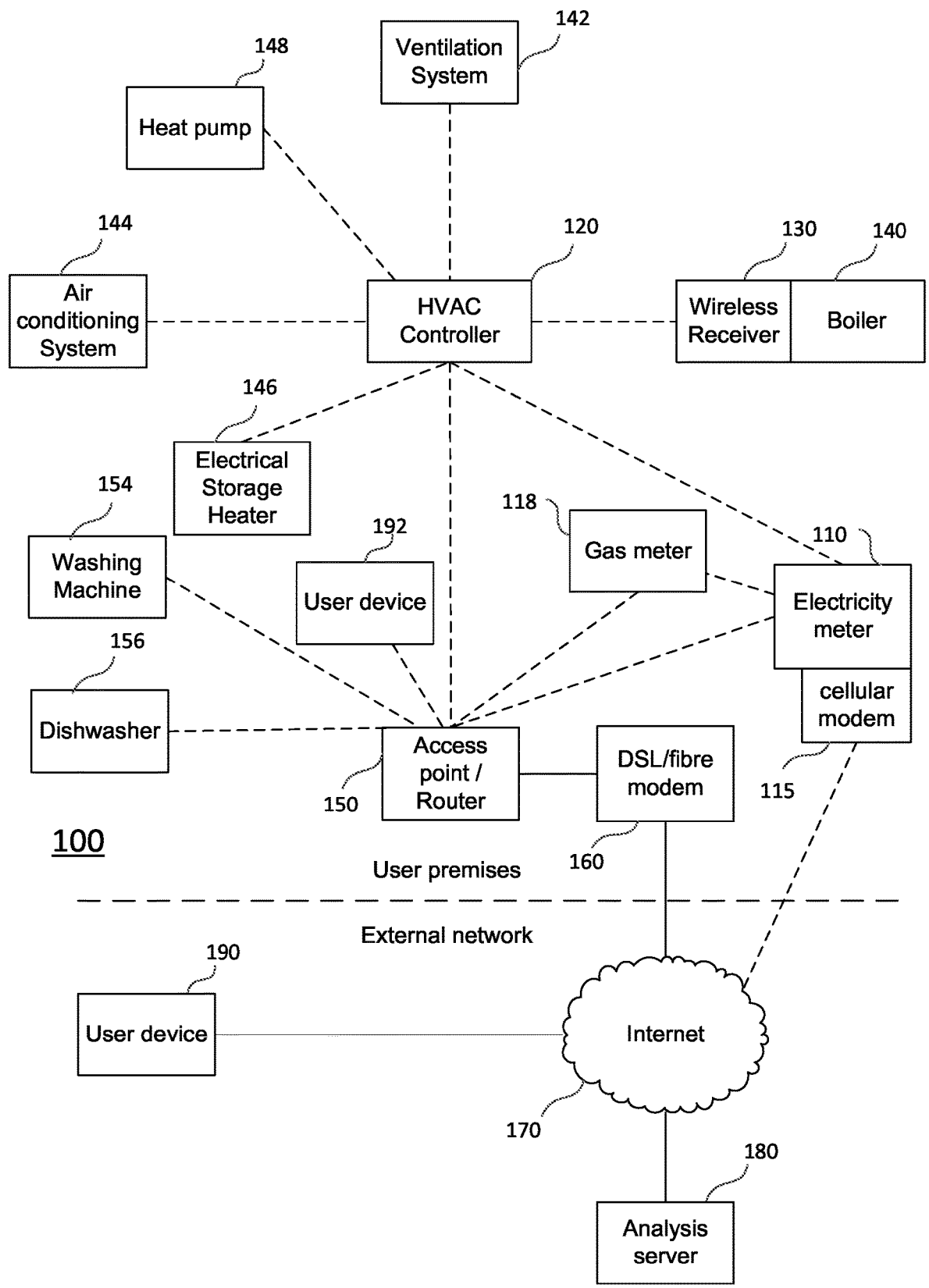
FIG. 1B illustrates an exemplary system for collecting and analysing data relating to energy consumption.

The method 1 shown in FIG. 1A may be performed at an analysis server 180, such as that shown in FIG. 1B. Alternatively different steps in the method 1 may be performed at different devices or servers.

FIG. 1B illustrates a system diagram of an exemplary energy usage analysis system 100. The energy usage analysis system 100 includes two utility meters: an electricity meter 110 and a gas meter 118 installed in a user's premises. The electricity meter 110 measures electricity consumption at the premises. The electricity meter 110 may be connected to the electricity supply point at the premises. The gas meter 118 is connected to the gas supply point and measures gas usage at the premises. The electricity meter 110 and the gas meter 118 record and report such consumption data periodically, in this case every 30 minutes.

The electricity meter 110 has a wireless Wide Area Network (WAN) interface in the form of an integrated cellular modem 115, such as a GSM, GPRS or 3G interface, which allows connection to the Internet 170. In some cases, instead of (or in addition to) the Internet, a connection to a smart meter network may be provided. The gas meter 118 and the electricity meter 110 each have a short-range wireless interface, such as a Wi-Fi 802.11 or a ZigBee 802.15.4 interface. The gas meter 118 does not have a cellular modem, but can connect to the Internet 170 via the electricity meter's cellular modem 115.

The electricity meter 110 sends consumption data to an analysis server 180 via its cellular connection to the Internet 170 every 30 minutes. Each data value indicates the amount of electricity consumed at the premises in a 30 minute time period, normally the 30 minute period immediately preceding the time at which the data value is recorded. The gas meter 118 can send gas consumption values (each value being the amount of gas consumed at the premises in a 30 minute time period) to the electricity meter 110 periodically, for example every 12 or 24 hours. The electricity meter 110 (via the cellular modem 115) can then send this gas consumption information on to the analysis server 180, via its connection to the Internet 170.

The electricity meter 110 and gas meter 118 may also receive information from the analysis server 180. For example, such information may include an indication of the state of the gas or electricity supply grid, timing information (such as the times at which peak or off-peak usage are set to begin) or tariff or pricing information. Alternatively, the electricity meter 110 and gas meter 118 may receive such information from another remote server, such as a control server, optionally operated by the utility provider. There may be separate analysis servers, one for receiving and analysing data from the gas meter 118 and one for receiving and analysing data from the electricity meter 110.

The electricity meter 110 and gas meter 118 are connected wirelessly to the user's local network/internet access infrastructure, for example, to a wireless or wired home router/access point 150, which in turn provides access to the Internet 170 through a modem 160, such as an ADSL or fibre modem. The connection between the utility meters and access point 150 may be via a short-range wireless network, such as ZigBee 802.15.4 or Wi-Fi 802.11. Depending on access technology, router 150 and modem 160 may be combined in a single device or replaced with other access devices appropriate to the access technology.

The energy usage analysis system 100 also includes an HVAC controller 120, such as a thermostat. The HVAC controller 120 may be, for example, a smart thermostat into which a user can program a heating, hot water or other environmental control schedule. The HVAC controller 120 is connected to a central heating/hot water boiler 140, a ventilation system 142 and an air conditioning system 144. The boiler 140 may, for example, be a conventional gas boiler arranged to provide a supply of heated water to a series of radiators in the user's premises and to a hot water tank for onward supply to hot water taps. The ventilation system 142 may be, for example, a humidity controlled ventilation system. The HVAC controller 120 is also connected to an electrical storage heater 146 and to a heat pump 148. Although five HVAC components 140, 142, 144, 146, 148 are shown, in some embodiments only one or two HVAC components may be provided, whilst in other embodiments there may be more and/or different HVAC components.

There is also provided a washing machine 154 and a dishwasher 156 at the user premises. These are wirelessly connected to the access point 150. A user can program a washing schedule, such as to activate the washing machine 154 and/or dishwasher 156 when certain criteria are satisfied, e.g. during off-peak periods, or when there is excess electricity supply on the grid. Alternatively, or additionally, a user may be able to activate the washing machine 154 or dishwasher 156 remotely, e.g. via an application on a mobile device which allows communication via the access point 150.

The HVAC controller 120 can then send control and/or schedule information to the HVAC components 140, 142, 144, 146, 148. For example the user can program a schedule for hot water at the HVAC controller 120, and the HVAC controller 120 can then send the hot water schedule to the wireless receiver 130. The wireless receiver 130 can then use the schedule and temperature information received from the HVAC controller 120 to turn the boiler 140 on or off as needed. The user can also program space heating or other environmental control requirements into the HVAC controller 120. Typically, this involves programming a heating schedule specifying a set of heating set points applicable during respective time periods, each set point defining a target temperature value to be achieved and maintained during the period. For example, the user may request a room temperature of 20° C. between 7 am and 9 am. Other periods in the schedule may be designated as "off" periods where no heating is required (though the system may nevertheless apply some minimum target e.g. 5° C. during such periods to protect against frost damage). The HVAC controller 120 receives a room temperature reading and can provide control signals to the boiler 140 or to the air conditioning system 144, as appropriate (e.g. to increase or decrease the temperature back to the scheduled target value). The HVAC controller 120 may also store instructions to send a command to the electrical storage heater 146 to initiate the heat storage mode of when certain criteria are satisfied, e.g. according to a pre-set time schedule and/or at times of excess supply on the electricity grid.

The user may also interact with electronic devices at the premises from a user device 190 located outside the user's premises on an external network and connected to the Internet 170. In some embodiments a user device 192 is located at the user premises and can be connected wirelessly (or by wired connections) to the user's local network, e.g. as shown the user device 192 can be in wireless communication with the access point 150. User devices 190, 192 may take the form of smartphones, tablet computers, personal computers, and the like. User devices may include an application for controlling appliances, or other electronic devices, at the premises. The application may then send information to the HVAC controller 120 or access point 150 as required (e.g. to update a schedule).

The HVAC controller 120 may send the control information and sensed information to a remote datacentre, such as the analysis server 180, on an external network, e.g. via its connection to the Internet 170. The analysis server 180 can log this information and store it for analysis.

While this description has focused on the home environment, the invention can also be used in offices or other premises in which electricity and/or another utility, such as gas or water, is used.

In alternative embodiments only one utility meter, such as only the electricity meter 110 may be provided. In other embodiments more than two utility meters may be provided at a premises, for example other types of utility meters such as water meters and/or multiple meters of the same type, such as two or more electricity meters at the same premises.

In alternative embodiments, each utility meter may have a WAN interface, such as a cellular GSM, GPRS or 3G modem 115. In other embodiments only the gas (or other utility) meter may have a WAN interface, and optionally the electricity meter may connect to the Internet 170 via the gas meter's WAN interface. In alternative embodiments, the meters may contain only a short-range wireless interface for connecting to the wireless network within the premises, such as Zigbee or WiFi 802.11, and communicate with the Internet 170 via the access point 150 and modem 160.

Figure 2A:
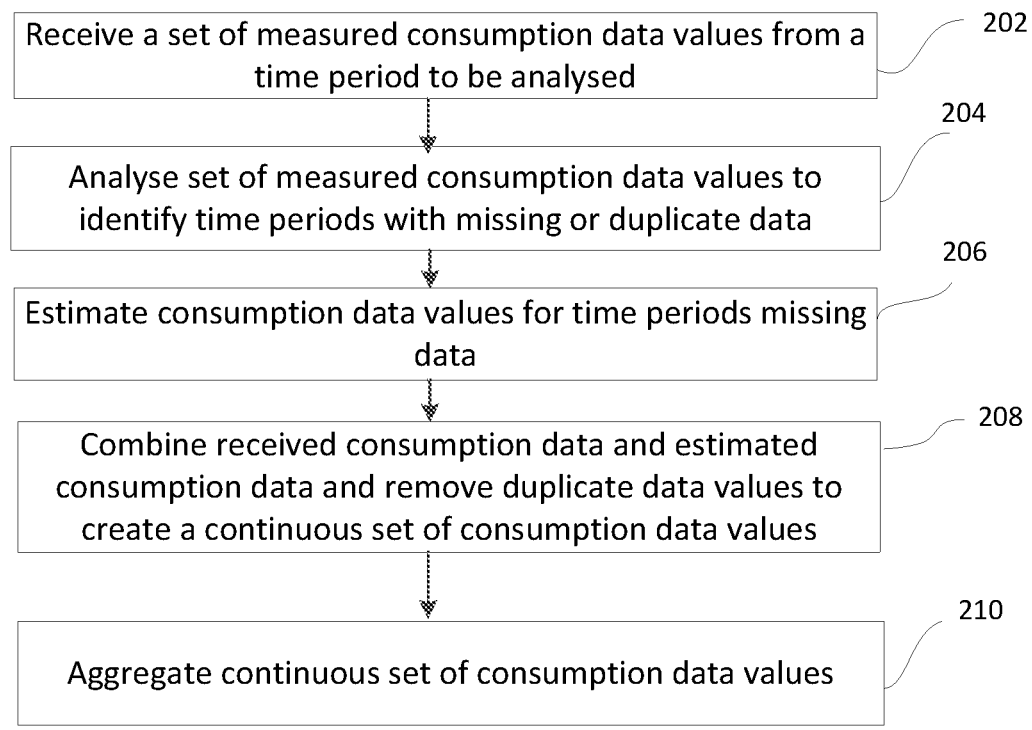
FIG. 2A illustrates an exemplary method for collecting and pre-processing data relating to energy consumption.

FIG. 2A shows an exemplary method 200A for receiving and pre-processing energy usage data. Method 200A may be used, for example, in steps 10 and 20 of method 1 (shown in FIG. 1A).

At step 202 a set, or time series, of measured consumption data values is received. The data values each correspond to consumption, such as energy consumption, for a time interval within a time period to be analysed. The time period to be analysed may be, for example, a period of a few days, a few weeks or a few months (e.g. at least seven days, at least 28 days, at least 90 days or at least three months; the time period may be less than ten years, less than five a years, or less than one year). The consumption data values were previously created by measuring consumption of a utility at a supply point. This may be, for example, electricity consumption or in other cases this could be gas or water consumption. Generally consumption is measured by a utility meter at the premises, such as the gas meter 118 or the electricity meter 110 shown in FIG. 1B. Consumption data values may be measured or recorded periodically at time intervals, for example, every 30 minutes. However, consumption data values may be recorded and/or reported at other frequencies, for example once an hour, once a day or more frequently, for example, once every 10 minutes or once every 20 minutes.

These measured consumption data values make up a set of measured consumption data values. Generally the set of measured consumption data values will be received by a server, such as the analysis server 180, shown in FIG. 1B. The set of values may be received from utility meters via the meters' cellular connections to a WAN, such as the Internet 170. The analysis server 180 may receive the consumption data values as they are generated, e.g. every 30 minutes, or may receive a set of multiple data values at the same time, for example relating to consumption of a premises over a predetermined time period, such as a day, a week or a month.

At step 204 the set of measured consumption data values is analysed to identify time periods (or individual time intervals) with incomplete, or missing, data values and/or duplicate values. A time period may comprise multiple individual time intervals, or time values or readings, for which a consumption value is expected. These time periods or individual times with missing (or duplicate) data may be interspersed throughout the set of consumption data values, or they may occur before the beginning or after the end of the set. The missing or duplicate values could be caused by, for example, meter removal, signal interruption or a system upgrade. This step (along with steps 206 and 208) of pre-processing the data may help to mitigate the problem of imperfect data.

At step 206 consumption data values for time periods with missing consumption data are estimated. Such estimation could be done in a variety of ways, for example values may be replicated from values recorded at the same time on previous days or in previous weeks. In other embodiments, linear interpolation may be used. This may involve extending the last seen legitimate value to the next closest legitimate value. This method can produce easily replicable results. However, linear ramping of consumption is rarely observed and linear interpolation may not work well even if the missing period is only moderately long as it would depict flat/slowly ramping consumption over the entire missing period. In preferred embodiments sampling from a probability distribution may be used, for example a Markov chain Monte Carlo method, as described in more detail in relation to FIG. 3 below.

At step 208 the received consumption data and estimated consumption data are combined in order to create a continuous, or gapless, set, or time series, of consumption data values. The continuous set may include one consumption data value for each expected time, for example a consumption data value for each 30 minute period. Duplicate consumption data values may also be removed, or discarded, at this stage.

At step 210 the continuous set of consumption data values is aggregated. This may involve reducing the granularity in the data through aggregation. For example, where consumption data values were measured every 30 minutes, this data could be aggregated into hourly data values. Such aggregation may be helpful for speeding up the computation process of later steps. However various levels of aggregation can be used, such as aggregating values into consumption values for two-hour or four-hour periods, or aggregation may be omitted. The level of aggregation may adjust the sensitivity of the analysis and may depend on the context and/or purpose of the analysis. For example, where the aim is to measure energy consumption flexibility, aggregation may adjust the sensitivity of flexibility measurement. The sensitivity may, for example, be determined by whether shifting energy load from one 30-minute slot to another 30-minute slot is considered flexible, or whether shifting from one 2-hour slot to another 2-hour slot is considered flexible (e.g. for 30-minute data, a shift from 2:00 pm to 2:30 pm can be considered flexible, whereas for data aggregated into two hour time blocks, shifting load from 2-4 pm to 4-6 pm may constitute flexible behaviour.

Figure 2B:
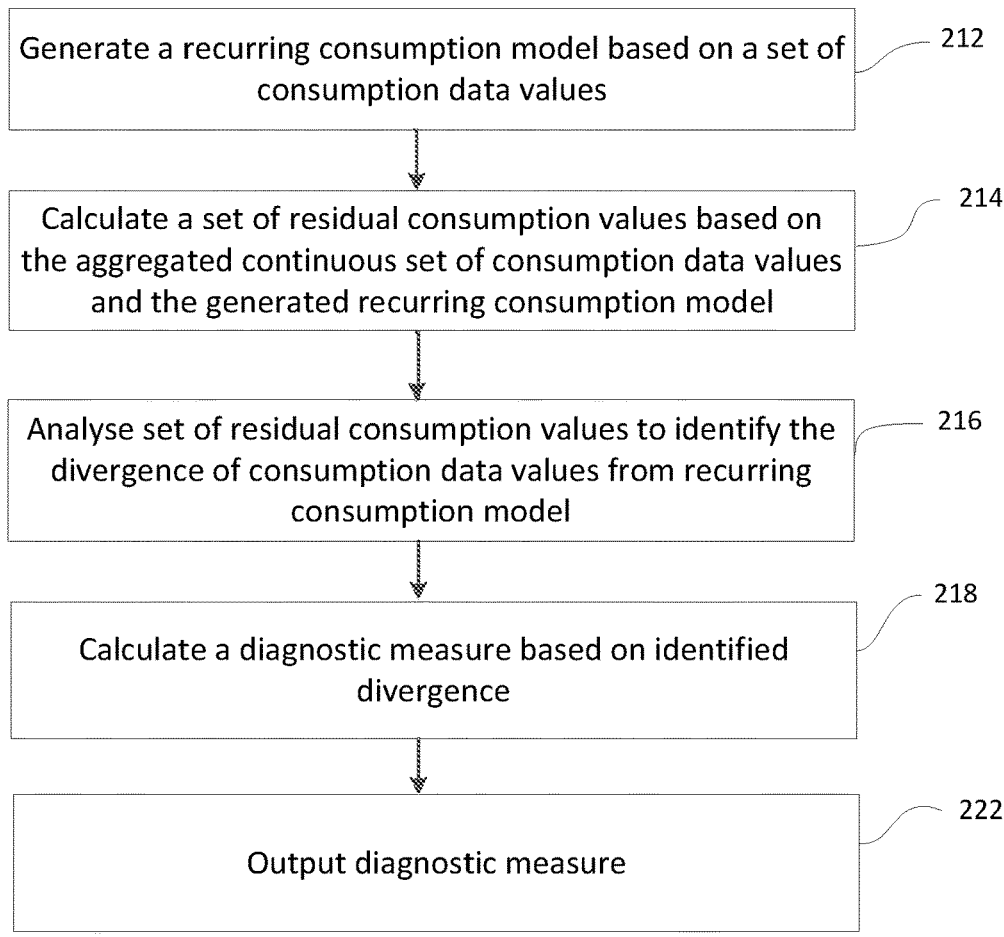
FIG. 2B illustrates an exemplary method for generating a model of recurrent or periodic consumption and determining a diagnostic measure.

FIG. 2B shows an exemplary method 200B for generating a model of recurrent or periodic consumption and determining a diagnostic measure.

At step 212 a recurring, or seasonal, consumption model is generated based on the aggregated set of consumption data values. "Seasonal" as used in this context is not restricted to the four seasons of the year (spring, summer, autumn, winter), and is intended to encompass any recurring patterns in consumption. However variation in consumption based on differences over the year, such as the four seasons, may be taken into account. The recurring consumption model may be generated based on the continuous aggregated time series of consumption data. The idea is to capture recurring patterns in usage. The time series may be used to generate the recurring consumption model according to a number of methods.

For example, time series decomposition may be used, where the observed data is decomposed into a seasonality (or recurring pattern) component, a trend component, and an error component. This means the observed data, $X_t$ may simply be the sum total of the trend, $T_t$, recurring, $S_t$, and error, $\epsilon_t$, components, $X_t = S_t + T_t + \epsilon_t$. Alternatively, a multiplicative time series may be defined as $X_t = S_t \times T_t \times \epsilon_t$. These components are generally easily decomposed. Either way, the component $S_t$ can be used as the seasonal model and the residual can be computed by subtraction $R_t = X_t - S_t$. This method normally requires a frequency parameter (the length of the recurring pattern) which may be fixed or dynamically searched, for example through trial and error.

In alternative methods, a time series transformation may be used, in order to identify recurring events or patterns. For example, the time series may be transformed into the frequency domain in order to identify strong frequency components which are used to generate the seasonal or recurring model. This may be an iterative process. A transformation such as a Fourier transform or a Fast Fourier Transformation (FFT) may be used.

At step 214 a set of residual consumption values is calculated based on the aggregated continuous set of consumption data values and the generated recurring consumption model. The set of residual consumption values represents the portion of consumption which is not captured by the recurring, or seasonal, consumption model; it can be considered as the irregular portion of the consumption, which does not appear to have a pattern.

At step 216 the set of residual consumption values is analysed in order to identify time periods in which consumption diverges from the recurring consumption model, e.g. irregular or flexible consumption. This may be relatively high (or low) consumption compared to the recurring consumption model. Time periods with relatively high consumption may be identified by detecting spikes in the residual time series, e.g. time values (or time periods of spanning multiple time values) showing high or increased consumption. For example, according to one method, the first-order difference between residual consumption at time t and time t−1 is calculated. This can allow a detection of the rising or falling edge of spikes. A threshold may be set which identifies periods of relatively high consumption as those in which the spike, or rising/falling edge, exceeds a certain threshold. For example, the threshold value may be 1 kWh. However, the threshold may be adjusted for different levels of sensitivity. In some embodiments a threshold for the gradient, or differential, of the residual model may be set (e.g. particularly high or low gradients, or gradients above a certain magnitude, will be identified as being indicative of a consumption spike). Filtering may also be performed at this stage, for example to remove spikes with magnitude that is lower than immediate neighbouring spikes. In some cases spikes which are temporally close to one another, for example two spikes occurring within a certain predetermined time period, may be identified and the lower, or weaker, spike may be removed.

At step 218 a diagnostic measure is calculated. An example of this diagnostic measure may be a consumption flexibility score, F, based on the identified time periods having divergent consumption. This may, for example, be based on the frequency at which periods of relatively high consumption (e.g. spikes) occur. For example, in one embodiment the consumption flexibility score, F, is calculated as the ratio of the number of the days with at least one spike to the total number of days in the aggregate continuous set of consumption data values. This results in a consumption flexibility score, F, between 0 and 1.

Flexibility consumption score, $$F = \frac{\text{Number of days with at least 1 spike}}{\text{Total number of days}}, F \in [0, 1]$$

In other embodiments the consumption flexibility score may be based on more information, such as the frequency of time periods of relatively high consumption, or spikes, during peak hours. Whilst peak hours are generally the same hours on each day, there may be some variation, for example to the different days of the week. In some cases peak hours may be different based on whether the day is a weekday or a weekend day.

At step 222 the diagnostic measure is output, or returned.

Figure 2C:
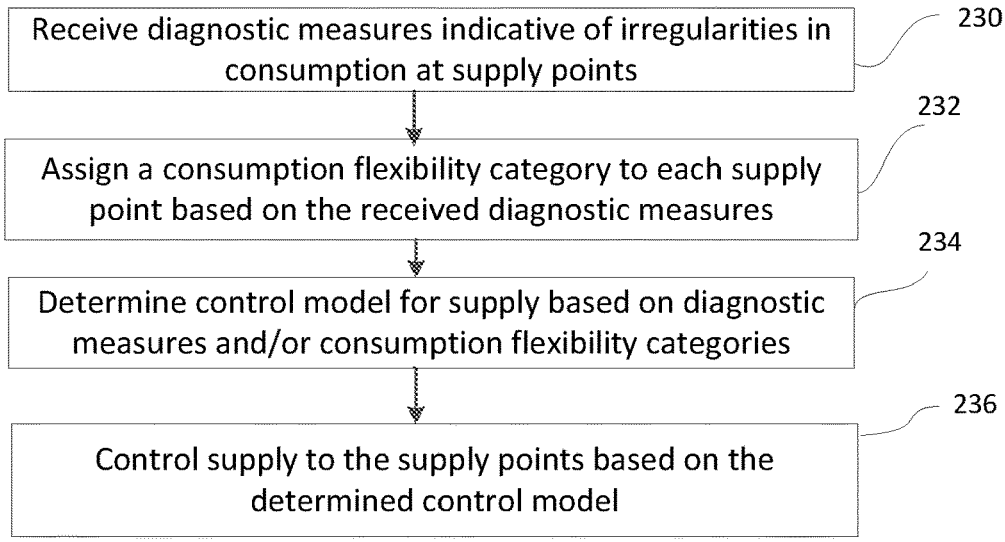
FIG. 2C illustrates an exemplary method for controlling a utility supply system based on a diagnostic measure.

FIG. 2C shows an exemplary method 200C for controlling a utility supply system based on the diagnostic measure.

At step 230 diagnostic measures computed for a plurality of supply points, indicative of irregularities in consumption at those supply points, are received. These may be the same measure that was output at step 222.

At step 232 (which is optional) each supply point may be assigned a flexibility category, such as "flexible", "inflexible" or "moderately flexible", based on the diagnostic measure. This may indicate how flexible the utility consumption of appliances or other utility consuming devices or machines at the supply point/supply location is (in other words, how well or badly consumption conforms to periodic consumption patterns).

At step 234 a supply control model is determined based on the diagnostic values and/or flexibility categories assigned to the supply points. This control model could for example, be based on control of the supply of energy or other utility, e.g. capacity of the electricity supply grid. For example, determining the supply control model could comprise reconfiguring utility supply settings, such as altering an electricity grid condition or configuration, e.g. adding or removing electricity generating components on the grid (e.g. power stations, wind farms, or hydroelectric power plants etc.). At step 236 the control model is implemented by controlling supply based on the model. This may involve sending commands to energy generation and/or grid equipment (such as power stations or hydropower plants, substations, energy storage facilities etc.).

Figure 3:
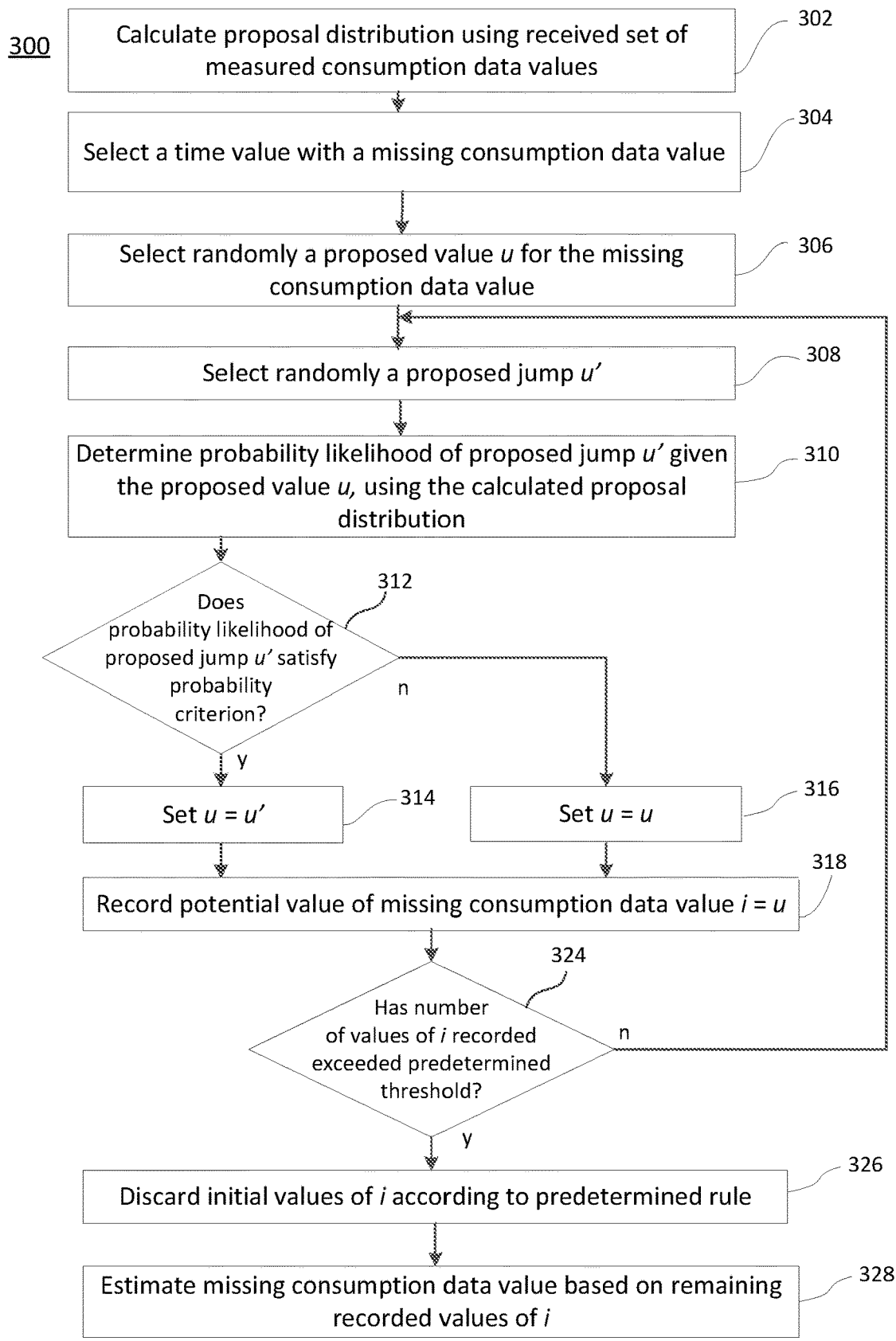
FIG. 3 illustrates an exemplary method for estimating consumption data values for time periods with missing data.

FIG. 3 illustrates an exemplary method 300 for estimating a consumption data value for a time period, or interval, with missing data. Some or all of the steps of the method 300 may be used at step 206 of method 200A of FIG. 2A to estimate consumption data values for time periods with missing data. The method 300 may use, for example, a Metropolis-Hastings algorithm or another type of Markov Chain Monte Carlo (MCMC) method for obtaining a sequence of rounding samples from a probability distribution. An advantage of MCMC method is that resampled values imitate the original target distribution. The method 300 of FIG. 3 may be repeated for each time interval without a data value in the received set of measured data values.

At step 302 a proposal distribution is calculated using a set of measure consumption data values, such as the set of measured consumption data values received at step 204 of method 200A of FIG. 2A. Normally, duplicate data values will be removed before calculating the proposal distribution. The measured consumption data may contain missing values.

At step 304 a time value, or interval, from the time period to be analysed that does not have a consumption data value is selected. As discussed above, missing consumption data values may arise for a number of reasons, for example faulty equipment, errors in transmission or data connections, removal and replacement of equipment or a system upgrade.

At step 306 a proposed value u for the missing consumption data value is randomly selected.

At step 308 a proposed jump u' is also randomly selected, which represents a proposed jump to another value for the missing consumption data value.

At step 310 the probability of the proposed jump u', given the proposed value u is determined using the proposal distribution calculated at step 302.

At step 312 it is determined whether the probability likelihood of the proposed jump u' satisfies a predetermined probability criterion. In one example, the probability criterion involves calculating the log of the likelihood of the proposed jump u' and also calculating the log of a random number a selected from a uniform distribution between 0 and 1. The criterion may be whether the log of this random number a—log(a)—is smaller than the log likelihood of the proposed jump u'. In other examples, the criterion may be whether the log of this random number a—log(a)—is smaller than the log acceptance ratio. The log acceptance ratio is a function of the probability of the missing consumption data value being u compared to the probability of the proposed jump u'.

If the probability criterion is satisfied then the method proceeds to step 314 and u is updated to the value of u'. This suggests that the likelihood of the missing consumption data value being u' is high enough to satisfy this random number criterion. If the probability criterion is not satisfied then the method proceeds to step 316 where u remains u.

At step 318 the potential value i of the missing consumption data value is recorded as u (i=u). The method then progresses to step 324.

At step 324 it is determined whether the number of values of i that have been recorded exceeds a predetermined threshold. If the number of values i have not yet reached the predetermined threshold then the method returns to step 308 and a new randomly selected proposed jump u is used. On the other hand, if the number of values of i recorded does exceed this predetermined threshold then the method progresses to step 326.

At step 326 the initial values of i that were recorded are discarded according to a predetermined rule. In some case this is known as a predetermined burn in value B. The first B values of i from the chain will be discarded due to the fact that the beginning of the chain may be located in a low density part of the probability distribution. The later values of i will be closer to the probability distribution and theoretically will provide a closer value for the missing consumption data.

At step 328 the missing consumption data value is estimated based on the values of i that have not been discarded, for example by calculating a mean or a median value of the remaining recorded values of i.

As the generated or estimated values have the same distribution as the original values, the impact of using estimated data can be reduced.

Algorithmic steps for a method of estimating missing values using MCMC are shown below.

---

Determine burn-in value B
Start at a randomly selected parameter where $u \in \mathbb{R}^k$
FOR n = 1, 2, 3 ... N -continued

```
    Determine jump u' ∈ ℝⁿ given the proposal distribution P(u'| u)
    Calculate log-likelihood of the proposed jump u'
    Draw a random number a from uniform distribution [0, 1]
    IF log a is smaller than the log-acceptance ratio THEN
        Yield u' and set u = u'
    ELSE
        Yield u
    END IF
END FOR
Discard items i₁, i₂, i₃ ... i_{B-1}
Return items i_B, i_{B+1}, i_{B+2} ... i_N
```

Figure 4A:
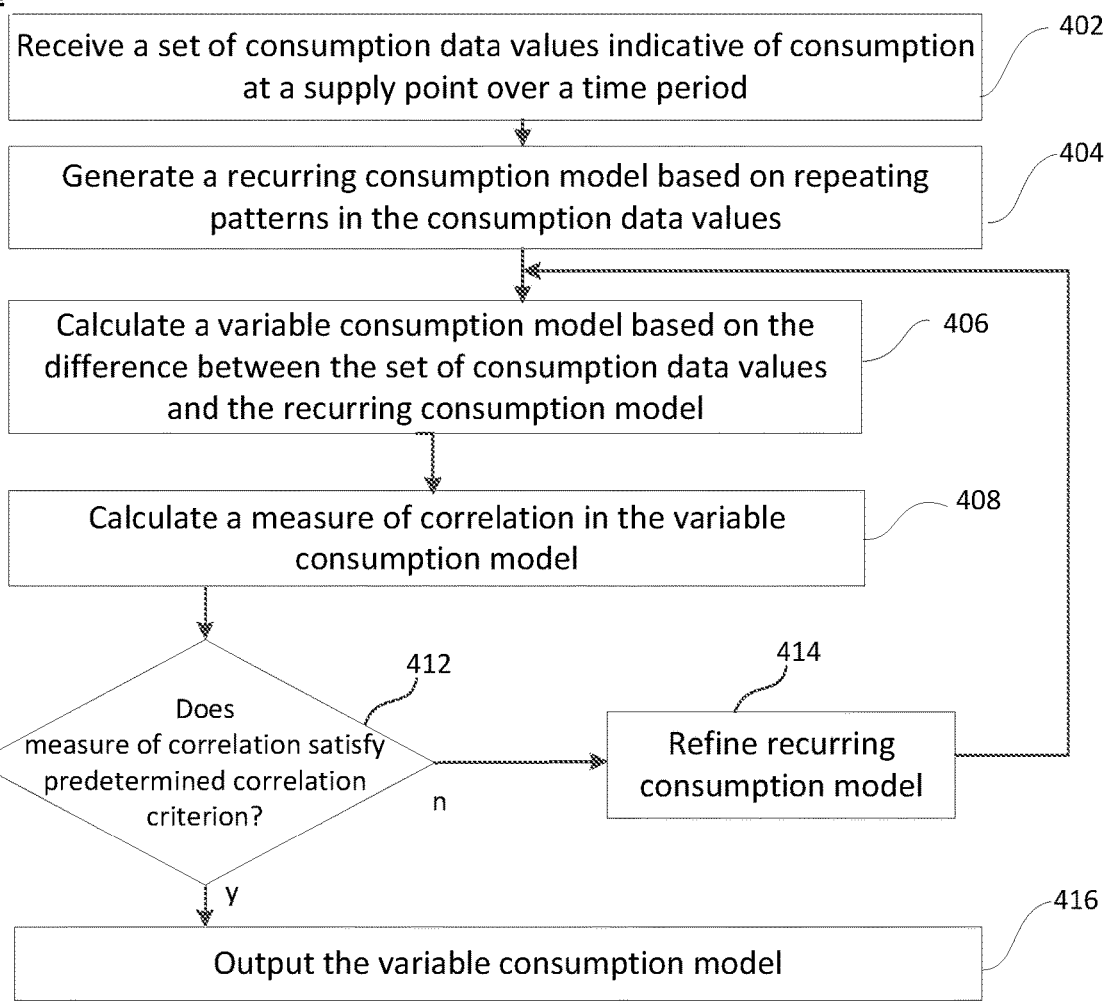
FIG. 4A illustrates an exemplary method for generating a recurring consumption model.

FIG. 4A shows an exemplary method 400A for generating a recurring consumption model, based on repetitive trends in consumption, and for deriving a model of variable, or irregular, consumption. This method 400A may be used for steps 30 and 40 of method 1 of FIG. 1A.

At step 402 a set of consumption data values which indicate the consumption of a utility at a supply point (such as energy or water) over a time period is received. This may be the same as, or equivalent to, step 202 in method 200A. The data may be aggregated and/or pre-processed (e.g. to add estimates of missing data) as described above.

At step 404 a recurring consumption model is generated based on repeating patterns in the consumption data. This may indicate consumption which occurs on a regular or a repetitive basis, such consumption having a daily, weekly or monthly pattern.

At step 406 a variable, or residual, consumption model is calculated. The variable consumption model will generally be calculated based on the difference between the set of consumption data values and the recurring consumption model. This may indicate any consumption which is not repetitive and/or cannot be modelled based on repeating trends. The variable consumption model may be, for example, a residual consumption value for each time interval over the time period, which equates to the difference between the consumption data value for that time interval and the consumption value for that time interval according to the recurring consumption model. Thus the variable consumption model may comprise a series of variable consumption data values, one for each time slot or interval.

At step 408 a measure of correlation in the variable consumption model is calculated. The correlation is calculated, which identifies the strength of periodic or repeating trends in the variable consumption data set.

At step 412 it is determined whether the measure of correlation satisfies a predetermined correlation criterion. For example, this criterion may be whether the measure of correlation is less than or equal to a correlation threshold value, which may be predetermined. If the measure of correlation does not satisfy the predetermined correlation criterion then the method continues to step 414.

At step 414 the recurring consumption model is refined based on the fact that the residual or variable consumption values do not satisfy that predetermined correlation criterion.

After step 414 the method returns to step 406, where the variable or residual consumption model is calculated based on the refined recurring consumption model that was calculated at step 414. This loop may continue iteratively until the correlation criterion is satisfied.

If the measure of correlation does satisfy the predetermined correlation criterion at step 412, then the method progresses to step 416. At step 416 the variable consumption model that was last calculated at step 406 is output. This may correspond to the set of residual consumption values calculated in step 214 of method 200B. Therefore, after step 416 the method may progress to step 216 of method 200B.

Figure 4B:
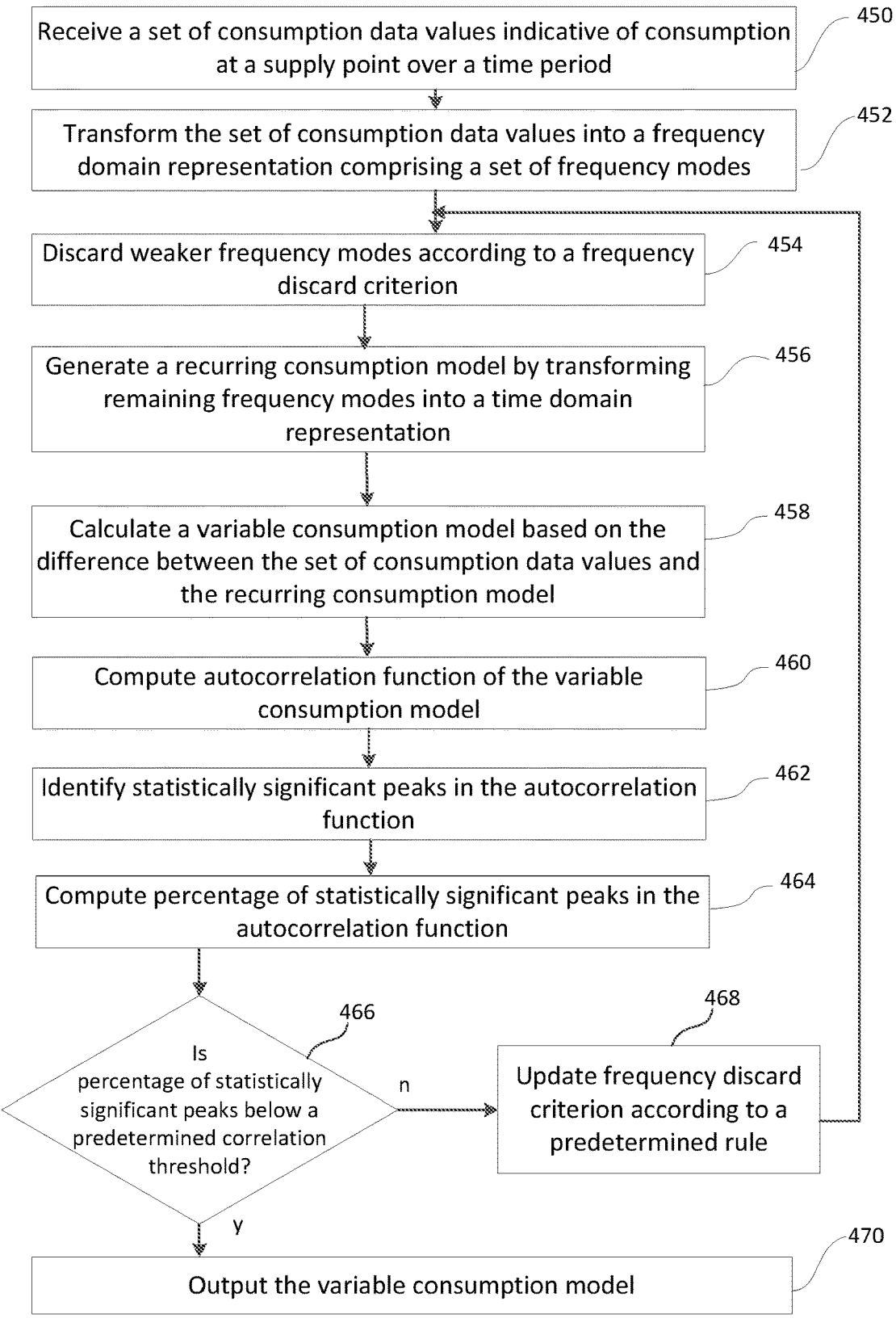
FIG. 4B shows another exemplary method for generating a recurring consumption model.

FIG. 4B shows a method 400B of generating a repeating or recurring consumption model according to a particular embodiment. This may be one example of performing the method of steps 212 and 214 of FIG. 2B.

At step 450 a set of consumption data values indicative of consumption at a supply point over a time period is received. This may correspond to step 402 of method 400A.

At step 452 the set of consumption data values is transformed into the frequency domain. This may, for example, be done by means of a Fourier transform or Fast Fourier transform. This results in a set of frequency modes which represent the consumption data set in the frequency domain, each frequency mode corresponding to a given frequency and associated with a frequency coefficient indicating a strength of the frequency in the input signal (i.e. the consumption data set). In some embodiments, the transform may result in a complex vector; in such cases the complex vector may be normalised.

At step 454 the weaker frequency modes (i.e. those with lower frequency coefficients) are discarded according to a frequency discard criterion. Generally this frequency discard criterion will result in a certain number or percentage of the weakest frequency modes being discarded. According to one example, the M weakest modes are discarded. For example this may be done by setting the weakest M modes to zero.

At step 456 a recurring consumption model is generated by transforming the remaining (or non-discarded) frequency modes into a time domain representation. This results in a signal that is made up of the repetitive or recurring consumption. This may be done by performing an inverse Fourier transform. Where Fourier or Fast Fourier transforms are used the real portion of the complex factor will be used to create a time domain signal.

At step 458 a variable consumption model is calculated based on the difference between the set of consumption data values and the recurring consumption model. As at step 406 of method 400A, the variable, or irregular, consumption model may be a set of values for consecutive time intervals over the time period.

At step 460 the variable, or residual, consumption data is fed through an Auto Correlation Function (ACF) to check for any remaining recurring patterns.

At step 462 statistically significant peaks in the Auto Correlation Function are identified. The statistically significant peaks may be identified as being any particular lags or peaks exceeding a certain threshold value.

At step 464 the percentage of statistically significant peaks in the Auto Correlation Function is computed.

At step 466 it is determined whether the percentage of statistically significant peaks in the Auto Correlation Function is below a predetermined correlation threshold value. In some embodiments this threshold value may be set at 5%. In other embodiments the threshold value may be greater or smaller, for example 2%, 3% or 10%. If it is determined at step 466 that the percentage is not below this correlation threshold this shows the residual consumption function still has too much periodicity, or repetition, so the method then proceeds to step 468.

At step 468 a frequency discard criterion is updated according to a predetermined rule. For example, the number of weakest frequency modes to be discarded at step 454 may be increased. The number of modes to be discarded may be increased by a predetermined increment.

The method then returns to step 454 where the weaker, or weakest, frequency modes in a frequency domain representation of the consumption data are discarded. This process may be repeated until it is determined at step 466 that the percentage of statistically significant peaks is below the predetermined correlation threshold.

At step 470 the last calculated variable consumption model (that calculated at the last time step 458 was performed) will be output. This may be analogous to step 416 of FIG. 4A and/or be the residual consumption values found in step 214 of method 200B.

An exemplary set of algorithmic steps for a method of using a Fast Fourier Transform (FFT) to calculate a model of repetitive consumption according to method 400B is shown below. Firstly, the FFT complex vector is obtained and normalised. Afterwards, the Fourier modes are sorted and the weakest ones are discarded incrementally. The remaining Fourier modes are then inversed via FFT and the real portion of the complex vector is used to create a time domain signal which acts as the recurrent consumption model. The original consumption data is differenced with the recurrent consumption model in order to calculate a model residual. The residual then feeds through the autocorrelation function (ACF) to check for any remaining periodicity. Statistically significant peaks in the ACF are calculated as a percentage p. This process repeats iteratively until the percentage p exceeds a predefined threshold C. C may be greater than 1% or 2%, or 5%. C may be less than 30%, less than 20% or less than 10% or 8%. In some embodiments C is around 5%. Once the iterative process finishes, the final recurrent consumption model is returned alongside the model residuals.

An exemplary algorithm for such an iterative process is shown below:

```
Determine increment value I and cut-off percentage C
Obtain the Fast Fourier Transform of the time series
Normalise the FFT complex vector
Set M=0 and p=1
WHILE p>C THEN
    Set M=M+I
    Rank the complex vector by real portion and set the weakest
    M modes to zero
    Compute inverse FFT using the updated complex vector
    Obtain the real portion of the inverse FFT and compute residual
    Compute autocorrelation function (ACF) of residual
    Set p as the percentage of lags in ACF exceeding threshold
Return the real portion of the complex vector as model fit
```

Figure 4C:
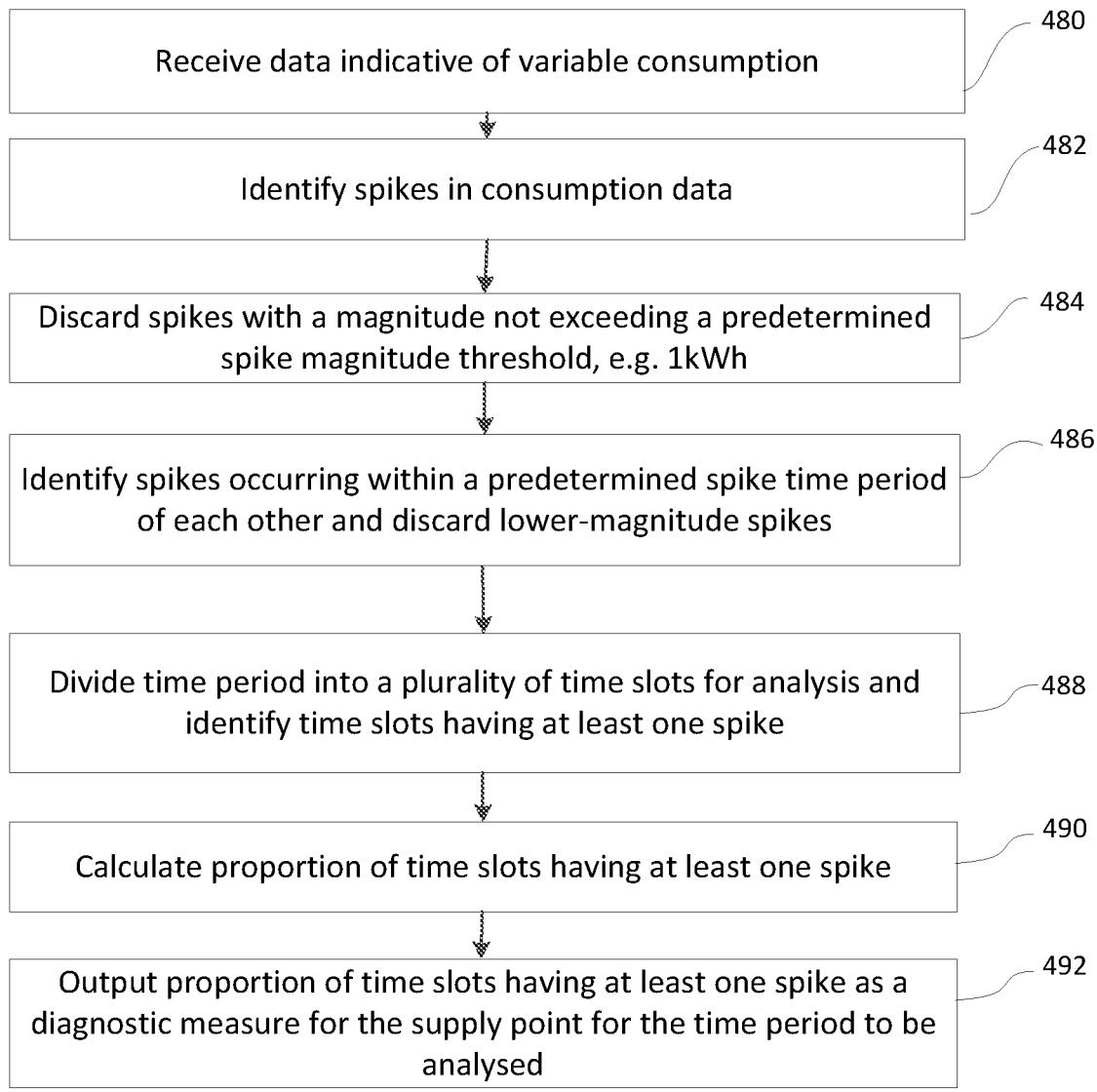
FIG. 4C shows an exemplary method for analysing consumption based on divergences from the recurring consumption model.

FIG. 4C illustrates an exemplary method for analysing variable consumption data.

At step 480 irregular or variable consumption data is received. This may be the data or model that was output at step 416 of FIG. 4A or step 470 of FIG. 4B.

At step 482 spikes in consumption data are identified. These may be spikes where the consumption is significantly higher than expected (i.e. the residual is positive) or lower than expected (i.e. the residual is negative).

Spikes may be identified in one example by calculating the first order difference between consecutive residual values. For spike detection, the algorithm retains the differenced residual and searches for rising edge (or falling edge instead).

At step 484 the spikes are filtered by removing or discarding spikes with a magnitude that does not exceed a predetermined threshold, e.g. 1 kWh. This may be adjusted for a different level of sensitivity.

At step 486 further filtering is performed: spikes occurring within a predetermined time period of each other are discarded. For example, two spikes occurring within a predetermined time period of each other, such as a day, four hours or eight hours, may be identified. Generally the lower-magnitude spike of the pair (positive or negative) will be discarded. Where multiple spikes occur in the same time period, all but the highest magnitude spike may be discarded.

An exemplary algorithm for filtering is shown below:

```
Identify rising (or falling) edges
Remove spikes whose magnitude is less than the predefined height
Remove spikes whose magnitude is less than that of its
    immediate neighbour
Sort the spikes in descending order
FOR n=N where N is the total number of spikes
    If the nth spike is not yet removed THEN
        Remove neighbouring spikes within the predefined distance
    END IF
```

At step 488 the time period is divided into a plurality of time slots for analysis. These time slots may comprise, for example, one day. In some embodiments these time slots may comprise a particular part of the day, such as the peak energy consumption period each day. The time slots having at least one spike in them are identified.

At step 490 the proportion of time slots having at least one spike is identified. In this example, this is the diagnostic measure.

At step 492 the proportion of time slots (calculated at step 490) is output as, or as part of, a diagnostic measure for the energy supply point for the time period that was analysed. In some embodiments the diagnostic measure is equal to the proportion (e.g. it may be a simple percentage or number between 0 and 1), or the diagnostic measure may be derived from the proportion (e.g. multiplied by a weighting, such as being the proportion multiplied by total consumption at the supply point over the period).

The diagnostic measure is indicative of irregular, or transient, consumption, which has no temporal repetition. For example, a high proportion of time slots having spikes in irregular consumption may show that consumption is often irregular and operation of machinery or appliances at the supply point is not according a fixed schedule of energy usage (or usage of another utility, e.g. water). This can suggest that their usage is more flexible; for example, it may be easier to change the usage to different times (e.g. a different time of day/week) without negatively affecting the lifestyle of users (at domestic supply points or impacting on business requirements (for commercial supply points). For example, someone who switches their washing machine on at different times every day or week, with very little temporal correlation, may more easily be able to change their washing time than someone who reliably uses their washing machine (and hence a specific consumption pattern) at the same/similar times each week. The utility could similarly use information on the flexibility of consumption at supply points to understand the potential peak loads and load variability when making decisions on the rating of network components or future network growth or changes.

The diagnostic measure may be used to help manage supply and demand on the grid, for example by managing demand during peak times. In some embodiments, the diagnostic measure may be used to activate demand-side response events (e.g. where a user switches off a load at a supply point during a peak time, either in response to an individual request for that day, or as a regular schedule). In some embodiments, high loads such as a washing machine, water heating etc. may be shifted e.g. to a different period of the day (or week).

For example, the system may use the diagnostic measure as a flexibility score, allowing utility supply points with flexible consumption behaviour (i.e. a tendency towards irregular consumption patterns, as indicated by a high flexibility score) to be identified. Those flexible supply points can then be targeted (e.g. energy consumption control messages, which may be sent by email/SMS communication) to alter consumption behaviour.

Alternatively or additionally, the system may implement automatic control actions based on the diagnostic measure, e.g. for controlling energy provision in the grid (as discussed in connection with FIG. 2C), and/or for providing information to supply locations or users to encourage consumption shifting.

Figure 5A:
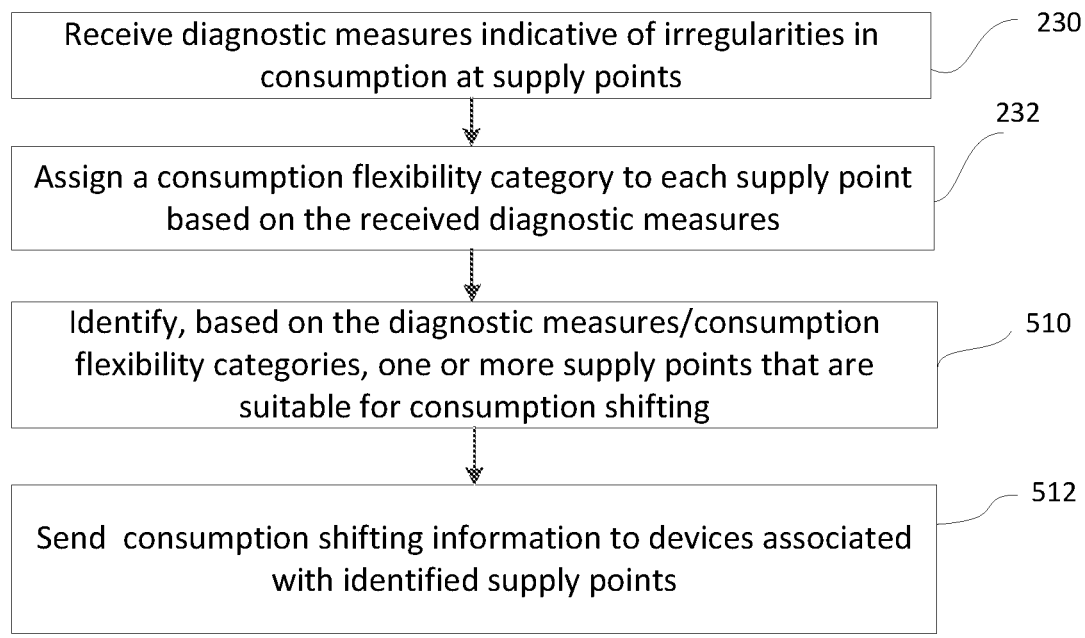
FIG. 5A illustrates an exemplary method for shifting consumption at utility supply points based on diagnostic values.

FIG. 5A shows an exemplary method 500A for shifting consumption at energy supply points. The method 500A begins at step 230, which may be the same as step 230 of method 200C shown in FIG. 2C. At step 230 diagnostic measures relating to a set of energy supply points is received. This diagnostic measures may have been calculated by using some or all of the methods shown in FIGS. 2A, 2B, 3, 4A, 4B and 4C. For example, the received diagnostic measures may be the diagnostic measure that is output in step 222 or step 492.

At step 232, which may be the same as step 232 of method 200C shown in FIG. 2C, each supply point is optionally assigned a consumption flexibility category based on the diagnostic measure. For example, possible categories may include one or more of "flexible", "very flexible" and "inflexible". In some cases, the category may be assigned dependent on the value of the diagnostic measure, e.g. whether the diagnostic measure is above or below a certain threshold.

At step 510, particular supply points that are suitable for implementing consumption shifting are identified based on the computed diagnostic measures or assigned flexibility categories. For example, a supply point with flexible consumption may indicate that altering consumption of the utility at that supply point (e.g. by altering consumption patterns/behaviour) may be acceptable for necessary running of appliances and other utility consuming equipment at that supply point or location. Consumption shifting may comprise concentrating consumption at times of low demand on the supply grid, for example off-peak periods, or at times of high supply. This may be times when supply is predictably high, for example when supply due to renewable sources such as tidal power is known to be higher, or when supply is unpredictably high, for example when supply generated by solar or wind power is high.

At step 512 consumption shifting information is sent to a device associated with a supply point if the supply point was deemed suitable for consumption shifting at step 510. This information may, for example, be sent to a user device, such as a smart phone, tablet or laptop, e.g. user device 190 or 192 shown in FIG. 1. In some embodiments the information may be sent to an email address, e.g. as an email, or telephone number, e.g. as a text or SMS message. In other embodiments, the information may be sent to a device such as the electricity or gas meter 110, 118, or an HVAC controller 120. The information may include control information to change non-time critical energy load to different times of day. The information may be presented to a user on a user device so the user can decide whether to implement consumption shifting.

Sometimes the information or commands may be sent during time periods in which consumption shifting can be implemented. The information may be sent dynamically, in that it may be sent in response to utility supply conditions, such as the current supply available on the grid. In this case, the information may be sent upon certain supply conditions being satisfied, e.g. when demand for the utility across the grid is detected to be below a certain threshold and/or when supply of the utility on the grid is detected to be above a certain threshold. Such information may provide control data to increase consumption. Alternatively, or additionally, information may be sent when demand for the utility across the grid is detected to be above a certain threshold and/or when supply of the utility on the grid is detected to be below a certain threshold (e.g. when demand is high and supply is comparatively low); such information may provide control data to reduce consumption. Thus sending the information may be triggered by the grid status. In other cases the sending of information may be done at times dependent on predictable and/or recurring grid conditions, such as peak usage times that recur predictably, e.g. every week or month.

For example, when demand is low compared to supply across the grid (or an area of the grid) a prompt message may be sent to a user device associated with a supply point categorised as "flexible". The user may then be able to make an informed decision about whether to shift their use of utility to use it during these periods of low demand/high supply. Users with high consumption flexibility may be more likely to act on such messages by shifting their consumption.

In other embodiments, information may be sent as the diagnostic measure is calculated, e.g. periodically. Such information may be sent less frequently (than when dependent on a grid status). Based on this the user may be able programme their own use schedule, e.g. timings for water heating, electric storage heaters etc.

Figure 5B:
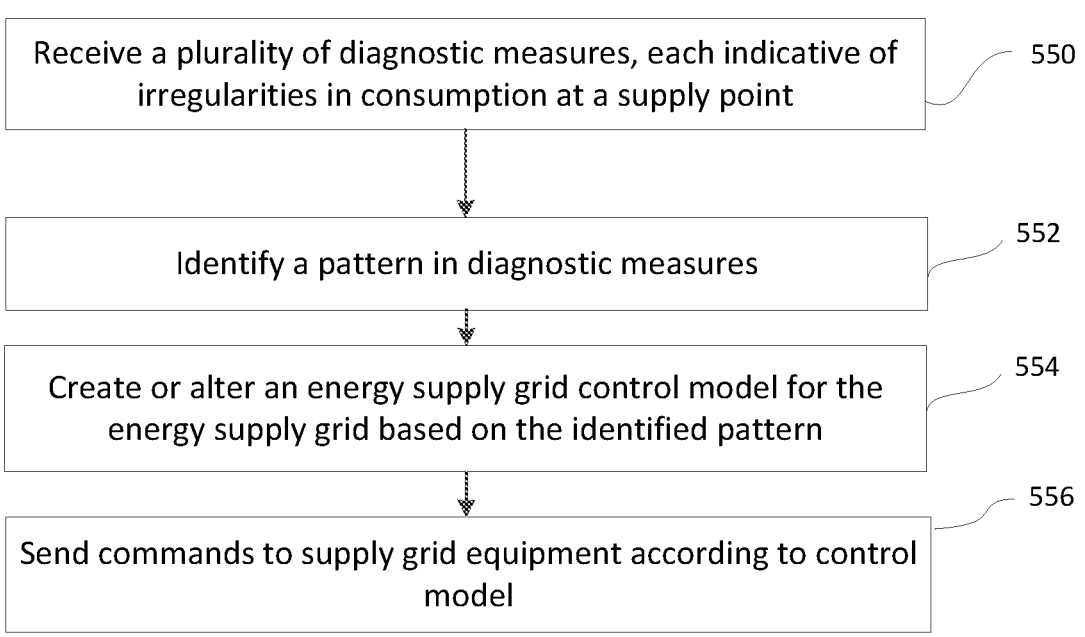
FIG. 5B illustrates an exemplary method for controlling a supply grid based on diagnostic values.

FIG. 5B shows a method 500B for controlling supply of a utility based on diagnostic values.

At step 550 a plurality of diagnostic values are received. Each diagnostic value is indicative of irregularities in consumption at a utility supply point, such as a consumer or business premises (e.g. a home, office or shop) which is supplied by a utility (e.g. gas, electricity or water). The diagnostic values may be for supply points within a certain geographical area, connected to a certain part or section of the grid. Other information may also be received along with the diagnostic values, such as the total consumption of the utility at the supply point, or what tariff the supply point is on.

At step 552 a pattern in the diagnostic values is identified. This pattern may show how variable, or flexible, consumption of the utility is across the grid during different periods (e.g. showing a recurring pattern over times of day and/or week). This may make it easier to control supply of the utility to the grid effectively.

At step 554 a supply grid control model is created or altered based on the identified pattern. For example, if it is found that supply of the utility during certain periods is fairly predictably flexible, but during other periods is not flexible, then it can be planned to ensure a greater supply is available during non-flexible periods, but not necessarily require such a large supply during the more flexible periods (where load at a plurality of supply points could more easily be shifted to other times).

In some embodiments step 554 may also comprise creating a model for consumption that can be applied to a plurality of supply points, for example to shift load during certain periods (e.g. when consumption is generally high, but flexible) to other periods (e.g. when consumption is lower).

At step 556 commands are sent to supply grid equipment, such as generators, power stations or other generation equipment such a hydropower plants or wind farms (for electricity supply), reservoirs (for water supply) or gas stores (for gas supply). These commands may, for example, cause the equipment to increase supply during periods where consumption is high but generally inflexible.

Figure 6:
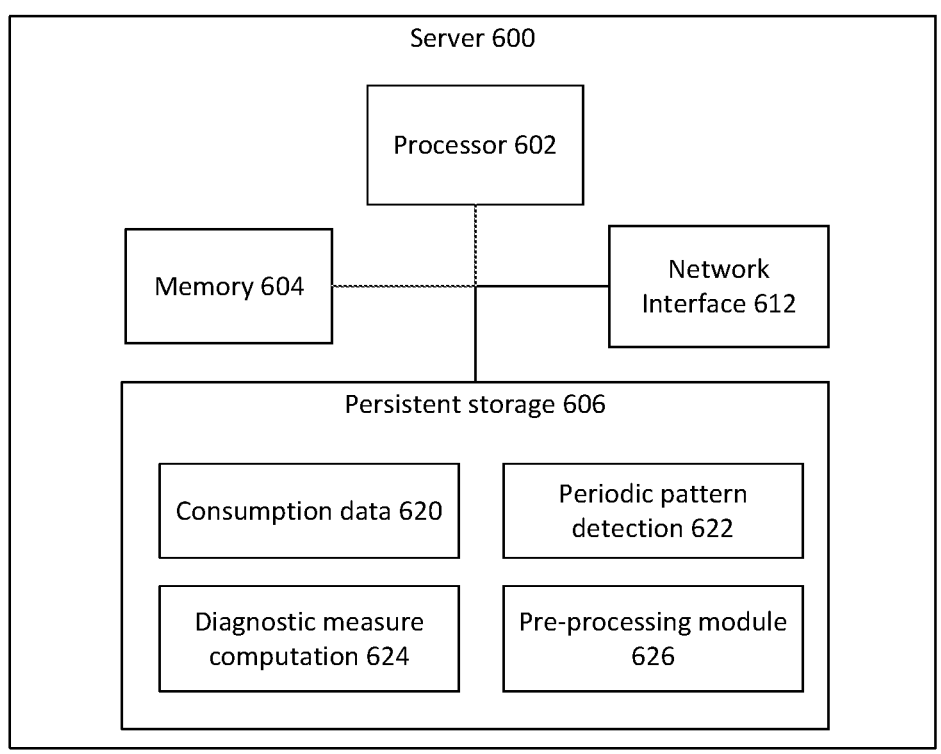
FIG. 6 illustrates a computer device suitable for performing described methods.

FIG. 6 shows a server 600, which may be used as analysis server 180 in FIG. 1B. The server 600 has a processor 602 and a random access memory 604. Server 600 also has a network interface 612 for connecting to a WAN, such as the Internet 170.

Server 600 also includes persistent storage 606 which can store consumption data 620, such as consumption data relating to supply points. Persistent storage 606 may also include a periodic pattern detection module 622 for detecting recurring patterns in consumption, as described above. Persistent storage 606 may also include a diagnostic measure computation module 624 for calculating a diagnostic measure relating to irregularities in consumption (e.g. in the form of a consumption flexibility score), along with a pre-processing module 626 for pre-processing consumption data to remove duplicate data or estimate missing data values.

Server 600 receives information, such as consumption readings, from the meters via the network interface, and uses the consumption data to calculate diagnostic metrics, as described above. The diagnostic metrics may be provided as output to an operator via a suitable user interface and/or to one or more local or remote control processes for controlling energy consuming equipment at the supply locations and/or energy supply equipment in the grid.

The above embodiments and examples are to be understood as illustrative examples. Further embodiments, aspects or examples are envisaged. It is to be understood that any feature described in relation to any one embodiment, aspect or example may be used alone, or in combination with other features described, and may also be used in combination with one or more features of any other of the embodiments, aspects or examples, or any combination of any other of the embodiments, aspects or examples. Furthermore, equivalents and modifications not described above may also be employed without departing from the scope of the invention, which is defined in the accompanying claims.

The invention claimed is:

1. A computer-implemented method of analysing utility consumption at a utility supply location, the method performed at an analysis server and comprising the steps of:
   receiving from a utility meter utility consumption data, the utility consumption data corresponding to utility consumption at the utility supply location over a time period to be analysed;
   generating recurring consumption data indicative of periodic consumption patterns in the utility consumption data;
   identifying divergences between the utility consumption data and the recurring consumption data;
   computing a diagnostic measure indicative of irregular consumption based on the identified divergences; and
   sending a control message to adjust, based on the diagnostic measure, one or both of: the utility supply from one or more suppliers; and the utility consumption of one or more utility supply locations;
   wherein the control message includes one of:
      a control command to utility supply or generation equipment to increase or decrease production or supply; and
      a control command to control operation of utility consuming equipment;
   wherein generating recurring consumption data comprises:
      performing a frequency domain transform on the utility consumption data to compute a frequency domain representation of the consumption data;
      discarding frequencies from the frequency domain representation according to a frequency discard criterion; and
   performing an inverse frequency domain transform on the frequency domain representation comprising the non-discarded frequencies to create a time domain representation of the consumption data based on the non-discarded frequencies.

2. A method according to claim 1, wherein generating recurring consumption data comprises performing a frequency analysis to determine frequency components of the utility consumption data.

3. A method according to claim 2, comprising selecting one or more frequency components and generating the recurring consumption data based on the selected frequency components.

4. A method according to claim 1, further comprising:
   calculating a difference between the time domain representation of the consumption data based on the non-discarded frequencies and the received utility consumption data;
   determining whether the calculated difference satisfies a correlation criterion; and if the calculated difference satisfies the correlation criterion, using the time domain representation of the consumption data based on the non-discarded frequencies as the recurring consumption data.

5. A method according to claim 4, wherein determining whether the calculated difference satisfies a correlation criterion comprises:
   calculating an autocorrelation function on the difference between the received utility consumption data and the time domain representation of the consumption data based on the non-discarded frequencies; and
   determining whether the autocorrelation function satisfies the correlation criterion.

6. A method according to claim 5, wherein determining whether the autocorrelation function satisfies the correlation criterion comprises:
   identifying statistically significant peaks in the autocorrelation function;
   computing a proportion of statistically significant peaks in the autocorrelation function; and
   determining whether the proportion of statistically significant peaks is below a predetermined correlation threshold.

7. A method according to claim 1, wherein the recurring consumption data comprises a times series of utility consumption data representative of repeating consumption patterns.

8. A method according to claim 1, wherein identifying divergences between the utility consumption data and the recurring consumption data comprises:

determining a set of residual consumption data from the difference between the utility consumption data and the recurring consumption data; and detecting signal features in the residual consumption data indicative of divergences.

9. A method according to claim 8, wherein detecting signal features indicative of divergences comprises:

identifying spikes in the residual consumption data by:

identifying rising and/or falling edges in the residual consumption data.

10. A method according to claim 1, wherein computing a diagnostic measure comprises:

determining a measure of the incidence of divergences between the utility consumption data and the recurring consumption data, wherein determining the incidence of divergences comprises:

dividing the time period into a plurality of time slots for analysis;

identifying time slots having at least a threshold number of divergences; and determining the number or proportion of time slots having at least the threshold number of divergences.

11. A method according to claim 1, wherein computing a diagnostic measure further comprises:

calculating the diagnostic measure as, or based on, a ratio of time slots having at least a threshold number of divergences to a total number of time slots in the time period.

12. A method according to claim 1, further comprising the step of:

pre-processing the received utility consumption data to compensate for abnormalities in the received consumption data, and using the pre-processed utility consumption data when generating the recurring consumption data, identifying divergences between the utility consumption data and the recurring consumption data and/or computing the diagnostic measure.

13. A method according to claim 1, comprising selecting one or more utility supply locations based on their respective diagnostic measures, the selected utility supply locations having diagnostic measures exceeding a threshold, and transmitting consumption control information to one or more of: the identified utility supply locations, users associated with the identified utility supply locations, and user devices associated with the identified utility supply locations.

14. A method according to claim 1, further comprising the step of:

controlling a supply of a utility in a utility supply grid that supplies the utility supply location based on the diagnostic measure or based on diagnostic measures computed for a plurality of supply locations.

15. A method of controlling utility supply in a utility supply grid comprising:

analysing utility consumption using a method as set out in claim 1 for a plurality of supply locations to output a plurality of diagnostic measures;

creating or altering a supply grid control model based on the plurality of diagnostic measures;

sending one or more commands to supply grid equipment according to the control model.

16. A method according to claim 15, wherein sending commands to supply grid equipment comprises sending commands to perform at least one of: change the capacity of the supply grid, and change the operation of energy generation equipment.

17. A method according to claim 1, wherein the received utility consumption data is received via a communications network, the utility meter located at the utility supply location, and comprises consumption data values measured by the utility meter.

18. A computer system or computing device having a processor with associated memory for performing the method of:

receiving from a utility meter utility consumption data, the utility consumption data corresponding to utility consumption at a utility supply location over a time period to be analysed;

generating recurring consumption data indicative of periodic consumption patterns in the utility consumption data;

identifying divergences between the utility consumption data and the recurring consumption data;

computing a diagnostic measure indicative of irregular consumption based on the identified divergences; and sending a control message to adjust, based on the diagnostic measure, one or both of: the utility supply from one or more suppliers; and the utility consumption of one or more utility supply locations;

wherein the control message includes one of:

a control command to utility supply or generation equipment to increase or decrease production or supply; and a control command to control operation of utility consuming equipment;

wherein generating recurring consumption data comprises:

performing a frequency domain transform on the utility consumption data to compute a frequency domain representation of the consumption data;

discarding frequencies from the frequency domain representation according to a frequency discard criterion; and performing an inverse frequency domain transform on the frequency domain representation comprising the non-discarded frequencies to create a time domain representation of the consumption data based on the non-discarded frequencies.

19. A non-transitory computer readable medium comprising software code adapted, when executed on a data processing apparatus, to perform the method of:

receiving from a utility meter utility consumption data, the utility consumption data corresponding to utility consumption at a utility supply location over a time period to be analysed;

generating recurring consumption data indicative of periodic consumption patterns in the utility consumption data;

identifying divergences between the utility consumption data and the recurring consumption data;

computing a diagnostic measure indicative of irregular consumption based on the identified divergences; and sending a control message to adjust, based on the diagnostic measure, one or both of: the utility supply from one or more suppliers; and the utility consumption of one or more utility supply locations;

wherein the control message includes one of:

a control command to utility supply or generation equipment to increase or decrease production or supply; and a control command to control operation of utility consuming equipment;

wherein generating recurring consumption data comprises:
  performing a frequency domain transform on the utility consumption data to compute a frequency domain representation of the consumption data;
  discarding frequencies from the frequency domain representation according to a frequency discard criterion; and
  performing an inverse frequency domain transform on the frequency domain representation comprising the non-discarded frequencies to create a time domain representation of the consumption data based on the non-discarded frequencies.

* * * * *